(12) United States Patent
Mok

(10) Patent No.: US 12,207,399 B2
(45) Date of Patent: Jan. 21, 2025

(54) COMPONENT CARRIER HAVING A DOUBLE DIELECTRIC LAYER AND METHOD OF MANUFACTURING THE SAME

(71) Applicant: AT&S (Chongqing) Company Limited, Chongqing (CN)

(72) Inventor: Jeesoo Mok, Chongqing (CN)

(73) Assignee: AT&S (Chongqing) Company Limited, Chongqing (CN)

( * ) Notice: Subject to any disclaimer, the term of this patent is extended or adjusted under 35 U.S.C. 154(b) by 7 days.

(21) Appl. No.: 17/247,378

(22) Filed: Dec. 9, 2020

(65) Prior Publication Data

US 2021/0195735 A1 Jun. 24, 2021

(30) Foreign Application Priority Data

Dec. 20, 2019 (CN) .......................... 201911323861.2

(51) Int. Cl.
*H05K 1/02* (2006.01)
*H05K 1/03* (2006.01)
(Continued)

(52) U.S. Cl.
CPC ........... *H05K 1/0298* (2013.01); *H05K 1/021* (2013.01); *H05K 1/036* (2013.01); *H05K 1/053* (2013.01);
(Continued)

(58) Field of Classification Search
CPC ...... H05K 1/0298; H05K 1/036; H05K 1/053; H05K 1/113; H05K 3/0047; H05K 3/0094;
(Continued)

(56) References Cited

U.S. PATENT DOCUMENTS 5,111,278 A * 5/1992 Eichelberger ....... H01L 23/5389
257/725
6,400,573 B1 * 6/2002 Mowatt .................. H05K 1/117
361/764
(Continued)

FOREIGN PATENT DOCUMENTS

CN 104241153 A 12/2014
CN 104253105 A 12/2014
(Continued)

OTHER PUBLICATIONS

Manook, R.; Partial European Search Report in Application No. 20 212 815.3; pp. 1-15; May 14, 2021; European Patent Office; 80298, Munich, Germany.
(Continued)

*Primary Examiner* — Ishwarbhai B Patel
(74) *Attorney, Agent, or Firm* — Robert A. Blaha; Smith Tempel Blaha LLC

(57) ABSTRACT

A component carrier has a stack including a plurality of electrically insulating layer structures and at least one electrically conductive layer structure, wherein two of the at least two electrically insulating layer structures form a dielectric double layer made of two different materials; a through-hole extending through the double dielectric layer; and an electrically conductive material filling at least a part of the through-hole. A method of manufacturing a component carrier is also disclosed.

28 Claims, 6 Drawing Sheets

(51) Int. Cl.
*H05K 1/05* (2006.01)
*H05K 1/11* (2006.01)
*H05K 1/18* (2006.01)
*H05K 3/00* (2006.01)
*H05K 3/46* (2006.01)

(52) U.S. Cl.
CPC .............. *H05K 1/111* (2013.01); *H05K 1/113* (2013.01); *H05K 1/181* (2013.01); *H05K 1/183* (2013.01); *H05K 3/0047* (2013.01); *H05K 3/0094* (2013.01); *H05K 3/4688* (2013.01); *H05K 2201/096* (2013.01)

(58) Field of Classification Search
CPC .... H05K 3/4688; H05K 1/185; H05K 3/0035; H05K 3/4673; H05K 2201/096; H05K 2201/09827; H05K 2203/1316; H01L 21/4857; H01L 21/486; H01L 23/145; H01L 23/3677; H01L 23/5389; H01L 21/6835; H01L 25/0652; H01L 2221/68359; H01L 2924/15153; H01L 24/19; H01L 2224/04105; H01L 2224/12105; H01L 2224/16227; H01L 2224/16235; H01L 2224/32245; H01L 2224/73267; H01L 2224/92244; H01L 23/49811; H01L 21/4846; H01L 21/4853; H01L 23/49827; H01L 23/49838; H01L 23/49894

See application file for complete search history.

(56) References Cited

U.S. PATENT DOCUMENTS

| | | | |
|---|---|---|---|
| 6,534,723 | B1 | 3/2003 | Asai et al. |
| 2005/0001331 | A1* | 1/2005 | Kojima ............... H01L 23/3121 |
| | | | 257/E23.128 |
| 2010/0132994 | A1 | 6/2010 | Fillion et al. |
| 2013/0026632 | A1* | 1/2013 | Kikuchi .............. H01L 21/6835 |
| | | | 257/E23.01 |
| 2015/0001708 | A1 | 1/2015 | Lin |
| 2015/0061139 | A1 | 3/2015 | Yap |
| 2016/0021753 | A1* | 1/2016 | Tomikawa ........... H05K 3/4697 |
| | | | 361/761 |
| 2016/0099213 | A1 | 4/2016 | Tae et al. |
| 2016/0233167 | A1* | 8/2016 | Shimizu ............... H01L 21/486 |
| 2018/0233429 | A1 | 8/2018 | Yosui et al. |
| 2018/0342788 | A1* | 11/2018 | Lasiter ............. H01L 21/02518 |
| 2019/0013273 | A1 | 1/2019 | Jeng et al. |
| 2019/0131253 | A1 | 5/2019 | Lee et al. |
| 2019/0148330 | A1 | 5/2019 | Chen et al. |
| 2019/0206781 | A1* | 7/2019 | Aleksov ........... H01L 23/49838 |
| 2019/0306988 | A1* | 10/2019 | Grober ................. H05K 1/0203 |
| 2020/0045825 | A1* | 2/2020 | Wu ........................ H05K 1/186 |

FOREIGN PATENT DOCUMENTS

| | | |
|---|---|---|
| CN | 109216219 A | 1/2019 |
| CN | 208337990 U | 1/2019 |
| CN | 109786260 A | 5/2019 |
| JP | 2001217543 A | 8/2001 |
| JP | 2005109037 A | 4/2005 |
| JP | 2010157663 A | 7/2010 |
| JP | 2016025143 A | 2/2016 |
| JP | 2016201508 A | 12/2016 |
| WO | 2018013121 A1 | 1/2018 |

OTHER PUBLICATIONS

Manook, R.; Extended European Search Report in Application No. 20212815.3; pp. 1-22; Jan. 14, 2022; European Patent Office; 80298, Munich, Germany.

First Office Action in Patent Application No. 201911323861.2, pp. 1-8; Dec. 5, 2022, The China National Intellectual Property Administration; No. 6, Xitucheng Lu, Jimenqiao Haidian District, Beijing City, 100088, China.

Office Action in Application No. 201911323861.2; pp. 1-15; Mar. 14, 2024; China National Intellectual Property Administration; No. 6, Xitucheng Lu, Jimenqiao Haidian District, Beijing City, 100088, P.R. China.

* cited by examiner

COMPONENT CARRIER HAVING A DOUBLE DIELECTRIC LAYER AND METHOD OF MANUFACTURING THE SAME

CROSS-REFERENCE TO RELATED APPLICATIONS

This application claims the benefit of the filing date of the Chinese Patent Application No. 201911323861.2, filed Dec. 20, 2019, the disclosure of which is hereby incorporated herein by reference.

TECHNICAL FIELD

The invention relates to a method of manufacturing a component carrier and to a component carrier.

BACKGROUND

A conventional component carrier comprises a stack having a plurality of electrically insulating layer structures and at least one electrically conductive layer structure, wherein a through-hole extends through an electrically insulating layer structure and an electrically conductive material fills at least a part of the through-hole.

Fan-out wafer level packaging (FOWLP) is one of the most recent packaging trends in microelectronics. It has a high potential for significant package miniaturization concerning package volume and package thickness. A technological basis of FOWLP is a formation of a reconfigured molded wafer combined with a thin film redistribution layer to yield an SMD-compatible package. Main advantages of FOWLP are a substrate-less package, low thermal resistances, an improved RF performance due to shorter interconnects together with direct IC connection by a thin film metallization instead of wire bonds or flip chip bumps and lower parasitic effects (parasitic inductances and capacitances). Especially the inductance in a package made by FOWLP is much lower compared to FC-BGA packages. In addition, the redistribution layer can also provide embedded passive components as well as antenna structures using a multi-layer structure. It can be used for multi-chip packages for a system-in-package (SiP) and a heterogeneous integration. For higher productivity and resulting lower costs, larger mold embedding form factors are desired.

SUMMARY

There may be a need to provide a component carrier and a method of manufacturing the same, by which the productivity and the heat management can be improved. This need is achieved by the subject matters of the independent claims.

According to an exemplary embodiment of the invention, a component carrier comprises a stack having a plurality of electrically insulating layer structures and at least one electrically conductive layer structure, wherein two of the at least two electrically insulating layer structures form a dielectric double layer made of two different materials; a through-hole extending through the double dielectric layer; and an electrically conductive material filling at least a part of the through-hole.

According to another exemplary embodiment of the invention, a method of manufacturing a component carrier comprises forming a stack comprising a plurality of electrically insulating layer structures and at least one electrically conductive layer structure, wherein two of the at least two electrically insulating layer structures form a dielectric double layer made of two different materials; forming a through-hole extending through the dielectric double layer; and at least a partially filling the through-hole with electrically conductive material.

The component carrier according to the present invention is not manufactured anymore on wafer level but on panel level so that the productivity and the yield is enhanced and the manufacturing costs are reduced. In addition, the manufacture on panel level allows a symmetrical build-up procedure by use of a temporary carrier so that the productivity can be further enhanced. Besides, the temporary carrier enables manufacturing of coreless component carriers so that a miniaturization of the component carrier is possible.

Overview of Embodiments

In the following, further exemplary embodiments of the present invention will be explained.

In an embodiment, the through-hole can be a tapering through-hole, in particular having a frustoconical shape. The through-hole can be a laser through-hole.

In an embodiment, the through-hole can extend through the entire double dielectric layer, or the through-hole can extend only through the double dielectric layer. Thereby, the through-holes can have any shape including a blind hole shape.

In an embodiment, the through-hole can be filled with an electrically conductive material and contact a pad which is arranged in or adjacent the dielectric double layer and forms a bottom of the through-hole. Thereby, the pad defines an accurate end of the through-hole.

In an embodiment, at least one electrically insulating layer structure of the dielectric double layer can be a molded material. The layer of the molded material can be thicker than the other one of the two electrically insulating layer structures which form a dielectric double layer. For example, the other one of the two electrically insulating layer structures, which form a dielectric double layer, can be a thinner and less rigid resin layer. If the thicker layer of the molded material is provided before manufacturing the thinner resin layer, warpage of the component carrier can be suppressed during the manufacturing process. This can particularly be advantageous in an asymmetric build-up process.

In an embodiment, at least one electrically insulating layer structure of dielectric double layer can comprise a resin, in particular resin without reinforcing structures, more particularly an epoxy derivative, in particular an epoxy-based build-up foil.

In an embodiment, the component carrier can comprise an embedded component, in particular an embedded die. The component carrier can further comprise a molded structure, wherein the component can be embedded in the stack and/or the molded structure. A copper material of pads of the component and/or of the electrically conductive layer structures can be adjacent to the molded structure. This configuration advantageously inhibits undesired electromigration of copper.

In an embodiment, the component carrier can comprise a thermally and electrically highly conductive block, particularly a copper inlay, in particular connected to a component. A main surface of the block can be attached to a main surface of the component. The component can be embedded more centrally in a thickness direction in the stack than the block. The block has a heat dissipation effect so that a cooling effect of the component carrier and particularly of the components therein can be obtained.

In an embodiment, a thickness of a double pillar in the stack can be substantially equal to a sum of the thickness of the block and a thickness of the component.

At least one of the following features can be implemented in the component carrier: The component carrier can comprise at least one component being surface mounted on and/or embedded in the component carrier, wherein the at least one component is in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip; wherein at least one of the electrically conductive layer structures of the component carrier can comprise at least one of the group consisting of copper, aluminum, nickel, silver, gold, palladium, and tungsten, any of the mentioned materials being optionally coated with supra-conductive material such as graphene; wherein the electrically insulating layer structure can comprise at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide; wherein the component carrier can be shaped as a plate; wherein the component carrier can be configured as one of the group consisting of a printed circuit board, a substrate, and an interposer; wherein the component carrier can be configured as a laminate-type component carrier.

In an embodiment, the method can further comprise forming at least two component carriers on both opposing main surfaces of a temporary carrier.

In an embodiment of the method, the through-hole can be a tapering through-hole, in particular having a frustoconical shape.

In an embodiment of the method, the through-hole can extend through the entire double dielectric layer, or the through-hole can extend only through the double dielectric layer.

In an embodiment of the method, the through-hole can be formed by a laser.

In an embodiment of the method, the through-hole can be filled with an electrically conductive material and contact a pad which is arranged in or adjacent to the dielectric double layer and forms a bottom of the through-hole.

In an embodiment of the method, at least one electrically insulating layer structure of the dielectric double layer can be molded by a molded material.

In an embodiment of the method, at least one electrically insulating layer structure of dielectric double layer can be formed by applying a resin, in particular resin without reinforcing structures, more particularly an epoxy derivative, in particular an epoxy-based build-up foil. In the context of the present invention, the term "applying" can comprise the application of a liquid or pasty material. The application can take place within a mold. The application can include a curing step. It may further include a "lamination" where prepared layers such as of a prepreg material are pressed together under heat application. The lamination can include a curing step.

In an embodiment, the method can further comprise embedding a component, in particular a die, into a cavity of the stack.

In an embodiment, the method can further comprise molding a molded structure, wherein the component is embedded in the stack and/or the molded structure.

In an embodiment of the method, a copper material of pads of the component and/or of the electrically conductive layer structures can be adjacent to the molded structure.

In an embodiment, the method can further comprise forming a thermally and electrically highly conductive block or inserting a copper inlay, and connecting the same to a component. In an embodiment, the method can further comprise attaching a main surface of the block to a main surface of the component. In an embodiment of the method, the component can be embedded more centrally in a thickness direction in the stack than the block.

In an embodiment of the method, a thickness "d" of a double pillar in the stack can substantially be equal to a sum of the thickness of the block and a thickness of the component.

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In an embodiment, the component carrier comprises a stack of at least one electrically insulating layer structure and at least one electrically conductive layer structure. For example, the component carrier may be a laminate of the mentioned electrically insulating layer structure(s) and electrically conductive layer structure(s), in particular formed by applying mechanical pressure and/or thermal energy. The mentioned stack may provide a plate-shaped component carrier capable of providing a large mounting surface for further components and being nevertheless very thin and compact. The term "layer structure" may particularly denote a continuous layer, a patterned layer or a plurality of non-consecutive islands within a common plane.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming through-holes through the laminate, for instance by laser drilling or mechanical drilling, and by filling them with electrically conductive material (in particular copper), thereby forming vias as through-hole connections. Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier having substantially the same size as a component (in particular an electronic component) to be mounted thereon. More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) or a photo-imageable or dry-etchable organic material like epoxy-based build-up material (such as epoxy-based build-up film) or polymer compounds like polyimide, polybenzoxazole, or benzocyclobutene.

In an embodiment, the at least one electrically insulating layer structure comprises at least one of the group consisting of resin (such as reinforced or non-reinforced resins, for instance epoxy resin or bismaleimide-triazine resin), cyanate ester, polyphenylene derivate, glass (in particular glass fibers, multi-layer glass, glass-like materials), prepreg material (such as FR-4 or FR-5), polyimide, polyamide, liquid crystal polymer (LCP), epoxy-based build-up film, polytetrafluoroethylene (teflon®), a ceramic, and a metal oxide. Teflon® is a registered mark of The Chemours Company FC LLC of Wilmington, Delaware, U.S.A. Reinforcing materials such as webs, fibers or spheres, for example made of glass (multilayer glass) may be used as well. Although prepreg particularly FR4 are usually preferred for rigid PCBs, other materials in particular epoxy-based build-up film or photo-imageable dielectric material for substrates may be used as well. For high frequency applications, high frequency materials such as polytetrafluoroethylene, liquid crystal polymer and/or cyanate ester resins, low temperature cofired ceramics (LTCC) or other low, very low or ultra-low DK materials may be implemented in the component carrier as electrically insulating layer structure.

In an embodiment, the at least one electrically conductive layer structure comprises at least one of the group consisting of copper, aluminum, nickel, silver, gold, palladium, and tungsten. Although copper is usually preferred, other materials or coated versions thereof are possible as well, in particular coated with supra-conductive material such as graphene.

The at least one component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. For example, the component can be an active electronic component, a passive electronic component, an electronic chip, a storage device (for instance a DRAM or another data memory), a filter, an integrated circuit, a signal processing component, a power management component, an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be a substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

The aspects defined above and further aspects of the invention are apparent from the examples of embodiment to be described hereinafter and are explained with reference to these examples of embodiment.

DETAILED DESCRIPTION OF EXEMPLARY EMBODIMENTS

Figure 1:
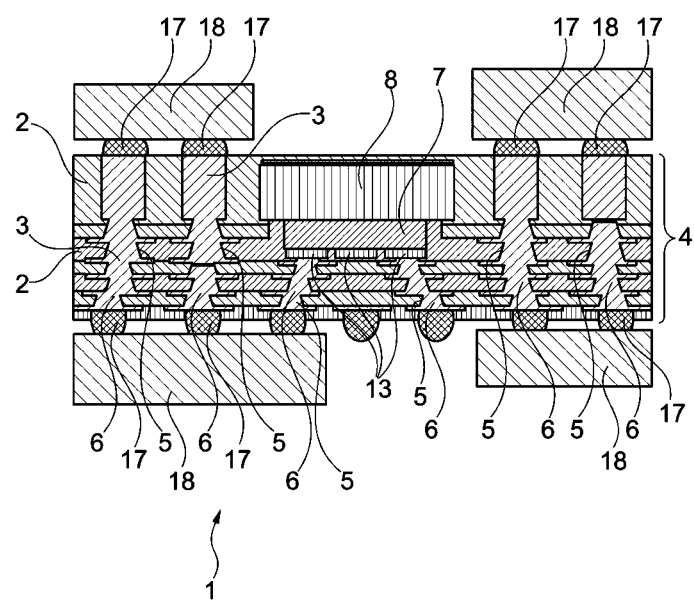
FIG. 1 illustrates a cross-sectional view of a component carrier according to an exemplary embodiment of the invention.

The illustrations in the drawings are schematically presented. In different drawings, similar or identical elements are provided with the same reference signs.

FIG. 1 illustrates a cross-sectional view of a component carrier 1 according to an exemplary embodiment of the invention. The component carrier 1 is shaped as a plate. The component carrier 1 can be configured as one of the group consisting of a printed circuit board, a substrate, and an interposer. The component carrier 1 can be configured as a laminate-type component carrier.

The component carrier 1 comprises a stack having a plurality, i.e., at least two electrically insulating layer structures 2 and electrically conductive layer structures 3.

The electrically conductive layer structures 3 of the component carrier 1 can comprise at least one of the group consisting of copper, aluminum, nickel, silver, gold, palladium, and tungsten, any of the mentioned materials being optionally coated with supra-conductive material such as graphene.

The electrically insulating layer structures 2 can comprise at least one of the group consisting of resin, in particular reinforced or non-reinforced resin, for instance epoxy resin or bismaleimide-triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide.

Two of the at least two electrically insulating layer structures 2 form a dielectric double layer 4 made of two different materials. In particular, at least one electrically insulating layer structure 2 of the dielectric double layer 4 can be a molded material, and/or at least one electrically insulating layer structure 2 of dielectric double layer 4 can comprise a resin, in particular a resin with or without reinforcing structures, such an epoxy derivative, in particular an epoxy-based build-up foil. For example, the upper one of the two electrically insulating layer structures 2 of the dielectric double layer 4 in FIG. 1 can be the molded material, and the lower one of the two electrically insulating layer structures 2 of the dielectric double layer 4 in FIG. 1 can be the resin.

Through-holes 5 extend through the double dielectric layer 4, and an electrically conductive material 6 fills the through-holes 5. Thereby, vertical vias or copper pillars are formed. The through-holes 5 can extend straight in the vertical direction of the component carrier 1. Alternatively, the through-holes 5 can extend at least a partially in an angle to the vertical direction, for example in a component carrier 1 which implements a redistribution structure.

A portion of the through-holes 5 can be a tapering through-hole, in particular having a frustoconical shape. In the embodiment of FIG. 1, the through-holes 5 in the lower one of the two electrically insulating layer structures 2 of the dielectric double layer 4 are formed as tapering through-holes; however, the invention is not limited thereto.

In particular, the through-holes 5 comprise a plurality of individual layered portions, which are arranged one above the other and which can be tapered, in particular in a frustoconical shape. The through-holes 5 or the individual portions of the through-holes 5 can be made by a laser beam so that the through-holes 5 are so called laser through-holes.

Some through-holes 5 extend through the entire double dielectric layer 4. In particular, these through-holes 5 can extend only through the double dielectric layer 4. That means, the through-holes 5 do not extend beyond the double dielectric layer 4. Other trough-holes 5 have a function to contact pads 13 of a component 7 with an outer surface of the component carrier 1, which is described later.

The component carrier 1 comprises an embedded component 7, in particular an embedded die. The component 7 can be surface mounted on and/or embedded in the component carrier 1. The component 7 comprises at its lower main surface in FIG. 1 the pads 13 which can be made of a copper material. The component 7 can be in particular selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an optoelectronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip.

The component carrier 1 further comprises a thermally and electrically highly conductive block 8, particularly a copper inlay, which is in particular connected to the component 7. A copper inlay is a pre-manufactured element which is inserted in the stack.

A main surface of the block 8, that can be a bonding surface of the block 8, is attached to a main surface of the component 7. The main surface of the component 7 can be a bonding surface of the component 7 or a surface where the pads 13 are arranged. The main surfaces of the block 8, of the component 7 and of the component carrier 1 are usually oriented in parallel to each other. A width of the block 8 measured in parallel to a main surface of the component carrier 1 is at least twice as large, preferred at least three times as large as a width of the vias, i.e., the copper pillars, which are formed by the electrically conductive material 6 which fills the through-holes 5 in the upper one of the two electrically insulating layer structures 2 of the dielectric double layer 4 in FIG. 1.

The component 7 is embedded more centrally in a thickness direction in the stack than the block 8. in particular, a vertical distance between the block 8 and an outer surface of the stack or of the component carrier 1 (in FIG. 1 the upper outer surface of the stack or of the component carrier 1) is smaller than a vertical distance between the component 7 and the outer surfaces of the stack or of the component carrier 1.

Although the component 7 is embedded in one of the two electrically insulating layer structures 2, which form the dielectric double layer 4, the component carrier 1 can further comprise an additional molded structure (not shown in FIG. 1), wherein the component 7 is embedded in the stack and/or the molded structure.

In a modified embodiment of the component carrier 1, the copper material of the pads 13 of the component 7 and/or of the electrically conductive layer structures 3 can be embedded or be adjacent to the molded structure in order to inhibit undesired electromigration of copper into the molded structure. In particular, those electrically conductive layer structures 3, which carry a high electric current, can be adjacent to the molded structure, for example the copper pillars in the upper one of the two electrically insulating layer structures 2 of the dielectric double layer 4 in FIG. 1, which have a larger diameter than the copper pillars in the lower one of the two electrically insulating layer structures 2 of the dielectric double layer 4 in FIG. 1.

Figure 2:
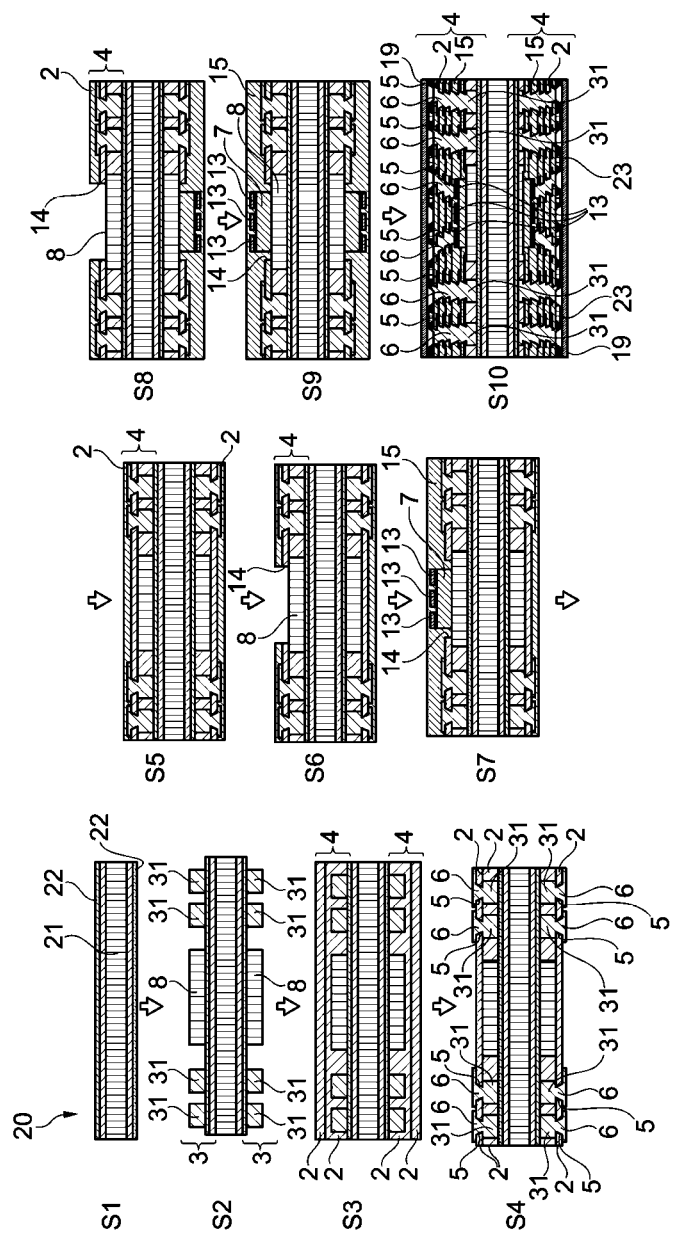
FIG. 2 illustrates a method of manufacturing a component carrier according to an exemplary embodiment of the invention.
Figure 3:
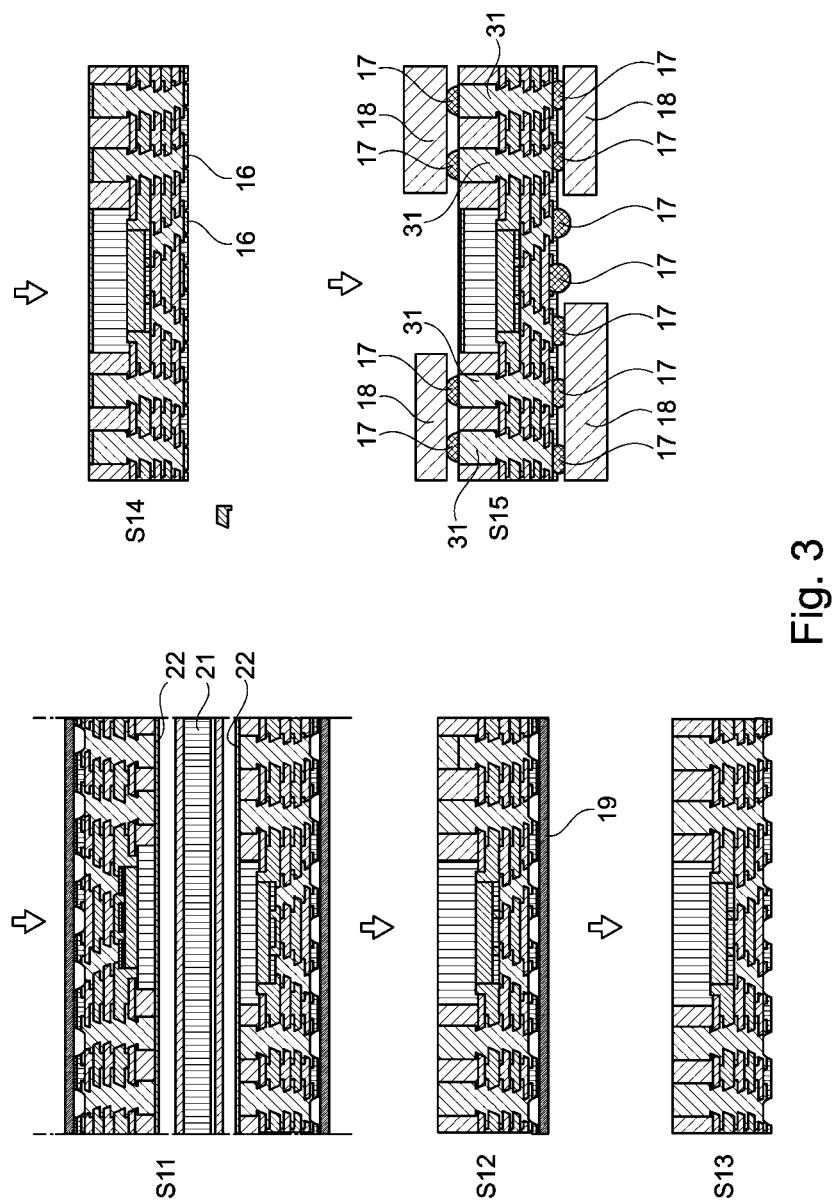
FIG. 3 illustrates the method of manufacturing a component carrier according to the exemplary embodiment of the invention.

FIG. 2 and FIG. 3 illustrate a method of manufacturing a component carrier 1 according to an exemplary embodiment of the invention. The method depicted in FIGS. 2 and 3 implements a symmetric built-up procedure where a stack is built-up on front and back sides of a temporary carrier. The symmetric built-up procedure is particularly efficient because two component carriers are manufactured by use of the same temporary carrier. However, this is not mandatory, and the method of FIGS. 2 and 3 can be implemented by an asymmetric built-up procedure where a stack is built-up only on one of front and back sides of a temporary carrier.

In a step S1, a temporary carrier 20 is provided. The temporary carrier 20 can comprise a base 21 and copper foils 22 at both main surfaces thereof.

In a step S2, electrically conductive layer structures 3 are provided at both main surfaces of the temporary carrier 20. For example, the electrically conductive layer structures 3 can be patterned or structured by conventional electroplating methods by use of copper which corresponds to the electrically conductive material 6 of the component carrier 1 in FIG. 1. In the embodiment, the electrically conductive layer structures 3 comprise a block 8 and pillars 31 which are formed at each main surface of the temporary carrier 20. A width of the block 8 measured in parallel to a main surface of the temporary carrier 20 can be at least twice as large, preferred at least three times as large as a width of the copper pillars 31.

In a step S3, the electrically conductive layer structures 3 are molded with a mold material. The mold material can form one of the at least two electrically insulating layer structures 2 which form a dielectric double layer 4 of the component carrier 1 (FIG. 1).

Thereafter, resin layers, such as of an epoxy derivative, in particular an epoxy-based build-up foil or a similar material, are applied onto the mold material on both sides of the stack manufactured so far. The resin layers can form another one of the at least two electrically insulating layer structures 2 which form the dielectric double layer 4 of the component carrier 1 (FIG. 1).

In a step S4, through-holes 5 are provided in the outer electrically insulating layer structures 2 which are made of resin. The through-holes 5 can axially be aligned to the associated pillars 31. Alternatively, the through-holes 5 can eccentrically be shifted from the associated pillars 31, for example in a component carrier 1 which implements a redistribution structure. The through-holes 5 can be laser through-holes, i.e., they are made by a laser beam such as by a $CO_2$ laser. In this case, the through-holes 5 can be tapering through-holes, in particular having a frustoconical shape. The through-holes 5 are filled with an electrically conductive material 6 such as copper.

In a step S5, other resin layers, such as of an epoxy derivative, in particular an epoxy-based build-up foil or a similar material, are applied onto the former resin layers on the front and back sides of the stack manufactured so far. These resin layers applied in step S5 can form another one of the at least two electrically insulating layer structures 2 which form the dielectric double layer 4 of the component carrier in FIG. 1.

In a step S6, a cavity 14 is formed at least in the resin layers 2 manufactured in step S5 at the front side of the component carrier 1. A depth of the cavity 14 extends up to the block 8.

In a step S7, at the front side of the stack manufactured so far, a component 7 is embedded in the cavity 14 and placed or bonded on the block 8. The component 7 comprises pads 13 which are arranged on one main surface of the component 7, which is opposite to another main surface of the component 7, which is placed or bonded on the block 8. In the embodiment of FIG. 2, the component 7 is placed with the pads 13 faced-upwards. Thereafter, the front side with the embedded component 7 is encapsulated by an encapsulating material 15. The encapsulating material 15 can form one of the two electrically insulating layer structures 2 which form the dielectric double layer 4 made of two different materials.

In a step S8, a cavity 14 is formed at least in the resin layers 2 manufactured in step S5 at a back side of the stack manufactured so far. A depth of the cavity 14 extends up to the block 8.

In a step S9, at the back side of the stack manufactured so far, a component 7 is embedded in the cavity 14 and placed or bonded on the block 8. The component 7 comprises pads 13 which are arranged on one main surface of the component 7, which is opposite to another main surface of the component 7, which is placed or bonded on the block 7. In the embodiment of FIG. 2, also the component 7 at the back-side is placed with the pads 13 faced-upwards. Thereafter, the back side with the embedded component 7 is encapsulated by an encapsulating material 15. The encapsulating material 15 can form one of the two electrically insulating layer structures 2 which form the dielectric double layer 4 made of two different materials.

In a step S10, further resin layers 2, such as of an epoxy derivative, in particular an epoxy-based build-up foil or a similar material, are applied onto the encapsulating material 15 on the front and back sides of the stack manufactured so far. The further resin layers 2 can form another one of the at least two electrically insulating layer structures 2 which form the dielectric double layer 4 of the component carrier in FIG. 1.

Through-holes 5 are provided in the outer electrically insulating layer structures 2 which are made of resin. The through-holes 5 can axially be aligned to the associated through-holes 5 which have already been manufactured. Alternatively, the through-holes 5 can eccentrically be shifted from the associated through-holes 5 which have already been manufactured, for example in a component carrier 1 which implements a redistribution structure. The through-holes 5 can be laser through-holes, i.e., they are made by a laser beam such as be a $CO_2$ laser. In this case, the through-hole 5 can be tapering through-holes, in particular having a frustoconical shape. The through-holes 5 are filled with an electrically conductive material 6 such as copper so as to further build-up the pillars 31 and to contact the pads 13 of the components 7.

Finally, a solder resist 23 and/or a protection film 19 such as a dry film can be applied to the outer surfaces of the stack manufactured so far.

Now with respect to FIG. 3, in a step S11, the stacks are trimmed and detached from the base 21 of the temporary carrier 20 or from the entire temporary carrier 20.

In a step S12, if the copper foils 22 of the temporary carrier 20 remain after step S11, they can be etched away.

In a step S13, the protection film 19 such as a dry film, which has been applied in step S10, is stripped.

In a step S14, a surface finish 16 is applied on the stacks.

In a step S15, bumps or solder balls 17 are applied on the ends of the copper pillars 31. A back-end process can be carried out, where further components 18 are bonded to the solder balls 17.

Figure 4:
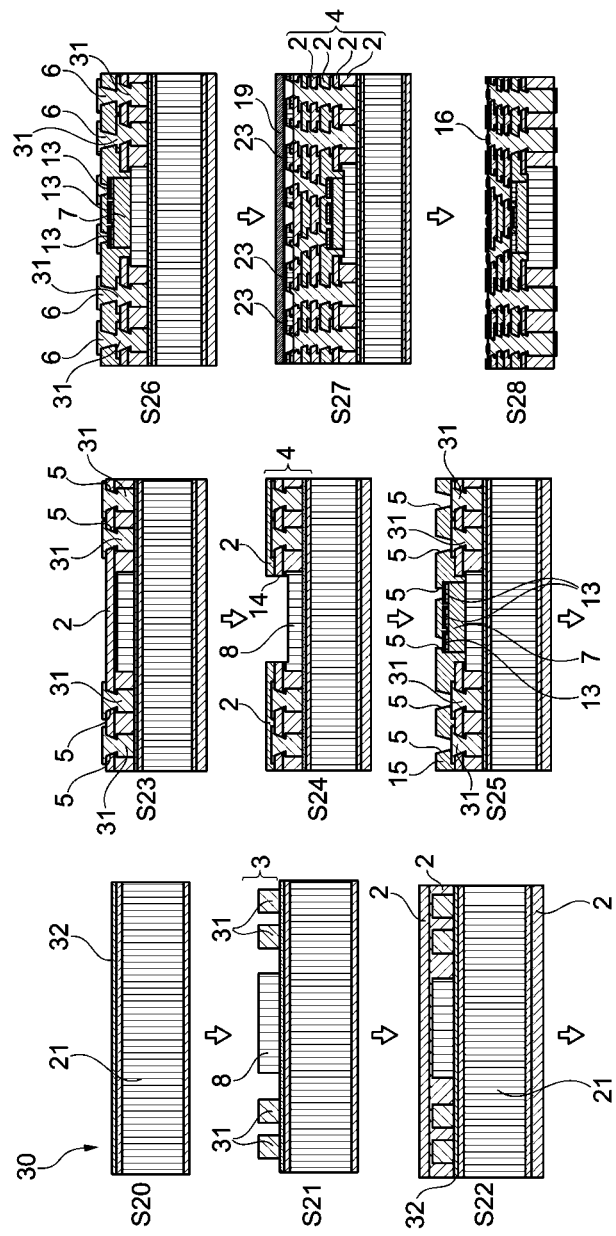
FIG. 4 illustrates a method of manufacturing a component carrier according to an exemplary embodiment of the invention.

FIG. 4 illustrates a method of manufacturing a component carrier 1 according to an exemplary embodiment of the invention. The method depicted in FIG. 4 implements an asymmetric built-up procedure where a stack is built-up only on one of the front and back sides of a temporary carrier. However, this is not mandatory, and the method of FIG. 4 can be implemented by a symmetric built-up procedure where a stack is built-up on front and back sides of a temporary carrier.

In a step S20, a temporary carrier 30 is provided. The temporary carrier 30 can comprise a base 21 and a copper foil 32 at only one or at both main surfaces thereof.

In a step S21, an electrically conductive layer structure 3 is provided at the one main surface of the temporary carrier 30. For example, the electrically conductive layer structure 3 can be patterned or structured by conventional electroplating methods by use of copper which corresponds to the electrically conductive material 6 of the component carrier 1 in FIG. 1. In the embodiment, the electrically conductive layer structure 3 comprises a block 8 and pillars 31 which are formed on the one main surface of the temporary carrier 30. A width of the block 8 measured in parallel to a main surface of the temporary carrier 30 can be at least twice as large, preferred at least three times as large as a width of the copper pillars 31.

In a step S22, the electrically conductive layer structure 3 is molded with a mold material. The mold material can form one of the at least two electrically insulating layer structures 2 which form a dielectric double layer 4 of the component carrier 1 (FIG. 1).

Thereafter, resin layers such as of an epoxy derivative, in particular an epoxy-based build-up foil or a similar material, are applied onto the mold material on the one side of the stack manufactured so far and optionally also on the other side of the temporary carrier 30. The resin layers at the one side of the stack manufactured so far can form another one of the at least two electrically insulating layer structures 2 which form the dielectric double layer 4 of the component carrier 1 (FIG. 1).

In a step S23, through-holes 5 are provided in the electrically insulating layer structure 2 at the one side of the stack manufactured so far, which are made of resin. The through-holes 5 can axially be aligned to the associated pillars 31. Alternatively, the through-holes 5 can eccentrically be shifted from the associated pillars 31, for example in a component carrier 1 which implements a redistribution structure. The through-holes 5 can be laser through-holes, i.e., they are made by a laser beam such as by a $CO_2$ laser. In this case, the through-hole 5 can be tapering through-holes, in particular having a frustoconical shape.

The through-holes 5, which are made in step S23, are filled with the electrically conductive material 6 such as copper so as to further build-up the pillars 31.

In a step S24, other resin layers such as of an epoxy derivative, in particular an epoxy-based build-up foil or a similar material, are applied on the former resin layer on the one side of the stack manufactured so far. The resin layer applied in step S24 can form another one of the at least two electrically insulating layer structures 2 which form the dielectric double layer 4 of the component carrier 1 (FIG. 1).

A cavity 14 is formed at least in the outer resin layers 2 at the one side of the stack manufactured so far. A depth of the cavity 14 extends up to the block 8.

In a step S25, at the one side of the stack manufactured so far, a component 7 is embedded in the cavity 14 and placed or bonded on the block 8. The component 7 comprises pads 13 which are arranged on one main surface of the component 7, which is opposite to another main surface of the component 7, which is placed or bonded on the block 7. Thereafter, the one side with the embedded component 7 is encapsulated by an encapsulating material 15. The encapsulating material 15 can form one of the at least two electrically insulating layer structures 2 which form the dielectric double layer 4 of the component carrier 1 (FIG. 1). Thereafter, through-holes 5 are formed in the encapsulating material 15. The through-holes 5 are aligned to the pillars 31 and the pads 13 of the component 7, respectively. Alternatively, the through-holes 5 can eccentrically be shifted from the associated pillars 31 and the pads 13, for example in a component carrier 1 which implements a redistribution structure. The through-holes 5 can be laser through-holes, i.e., they are made by a laser beam such as by a $CO_2$ laser. In this case, the through-holes 5 can be tapering through-holes, in particular having a frustoconical shape.

In a step S26, the through-holes 5 made in step S25 are filled by an electrically conductive material 6 such as copper so as to further build-up the pillars 31 and to contact the pads 13 of the component 7.

In a step S27, further resin layers 2 such as of an epoxy derivative, in particular an epoxy-based build-up foil or a similar material, are applied onto the encapsulating material 15 on the one side of the stack manufactured so far. The further resin layers 2 can form one of the at least two electrically insulating layer structures 2 which form the dielectric double layer 4 of the component carrier 1 (FIG. 1). Through-holes are formed in the resin layers 2, which are manufactured in step S27. These through-holes 5 are aligned to the pillars 31 and the pads 13 of the component 7, respectively. Alternatively, the through-holes 5 can eccentrically be shifted from the associated pillars 31 and the pads 13, for example in a component carrier 1 which implements a redistribution structure. The through-holes 5 can be laser through-holes, i.e., they are made by a laser beam such as by a $CO_2$ laser. In this case, the through-hole 5 can be tapering through-holes, in particular having a frustoconical shape. These through-holes are filled with the electrically conductive material 6 such as copper so as to further build-up the pillars 31.

A solder resist 23 and/or a protection film 19 such as a dry film can be applied to the outer surface of the stack manufactured so far.

In a step S28, the stack is trimmed and detached from the base 21 of the temporary carrier 30 or from the entire temporary carrier 30. If the copper foil 32 of the temporary carrier 30 remains, it can be etched away.

The protection film 19 such as a dry film can be stripped.

A surface finish 16 is applied on the stacks.

Although not shown in FIG. 4, bumps or solder balls can be applied on the ends of the copper pillars 31. A back-end process can be carried out, where further components are bonded to the solder balls.

Figure 5:
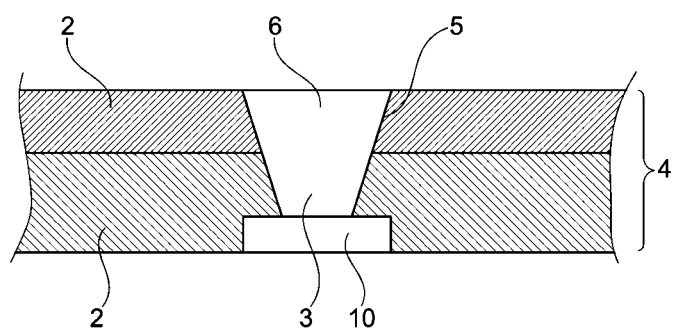
FIG. 5 illustrates a part of a component carrier according to an exemplary embodiment of the invention.

FIG. 5 illustrates a part of a component carrier 1 according to an exemplary embodiment of the invention. The component carrier comprises a stack comprising a plurality of electrically insulating layer structures 2 and at least one electrically conductive layer structure 3, wherein two of the at least two electrically insulating layer structures 2 form a dielectric double layer 4 made of two different materials. The component carrier 1 can be similar to that of FIG. 1. One of the electrically insulating layer structures 2 of the dielectric double layer 4 can be a molded material, and the other one of the electrically insulating layer structures 2 of the dielectric double layer 4 can comprise a resin, in particular resin without reinforcing structures, more particularly an epoxy derivative, in particular an epoxy-based build-up foil. For example, the lower electrically insulating layer structure 2 in FIG. 5 can be a molded material, and the upper electrically insulating layer structure 2 in FIG. 5 can be a resin.

A through-hole 5 extends through the double dielectric layer 4, and an electrically conductive material 6 fills at least a part of the through-hole 5. The through hole 5 can be made by a laser such as a $CO_2$ laser. The conductive material can thus form a laser via. The through-hole 5 can be a tapering through-hole, in particular having a frustoconical shape. The through-hole 5, which is filled with the electrically conductive material 6, contacts a pad 10 which is arranged in or adjacent the dielectric double layer 4 and forms a bottom of the through-hole 5. The pad 10 can be a part of a pillar or a via. The pad 10 can also be a pad of a component. The pad 10 can be made of a metallic material such as copper.

When the through-hole 5 is formed, for example by a laser or by etching, the pad 10 functions as a stopper so that the laser beam or an etching fluid cannot propagate further.

Figure 6:
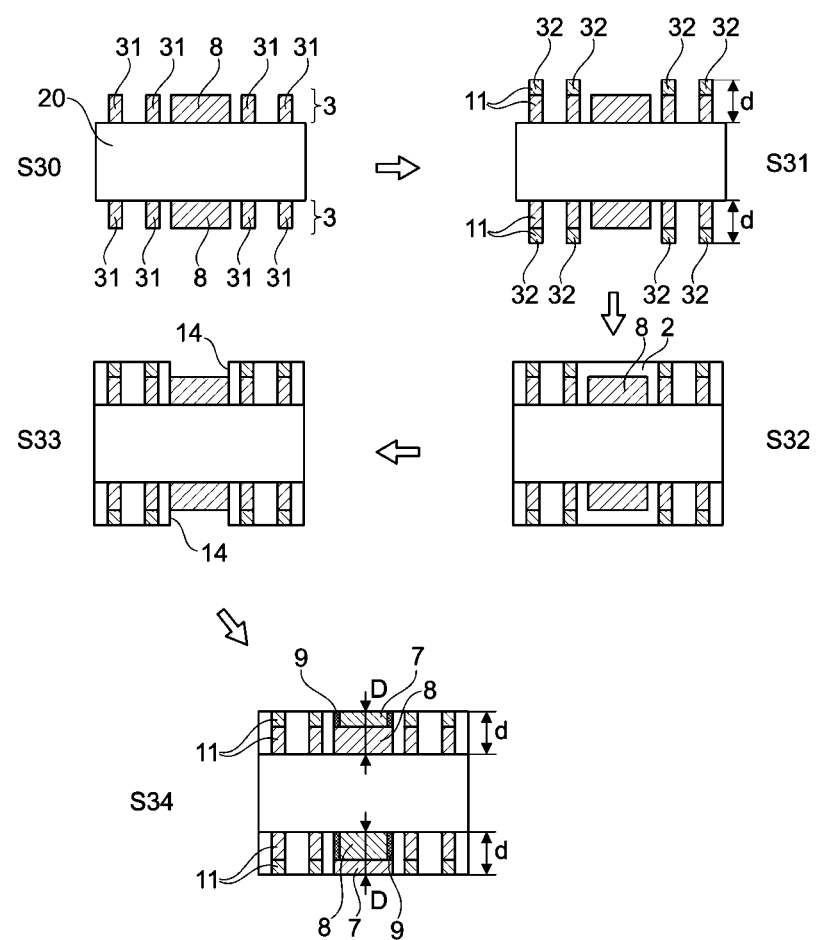
FIG. 6 illustrates a method of manufacturing a component carrier according to an exemplary embodiment of the invention.

FIG. 6 illustrates a method of manufacturing a component carrier 1 according to an exemplary embodiment of the invention. The method depicted in FIG. 6 implements a symmetric built-up procedure where a stack is built-up on front and back sides of a temporary carrier. The symmetric built-up procedure is particularly efficient because two component carriers are manufactured by use of the same temporary carrier. However, this is not mandatory, and the method of FIG. 6 can be implemented by an asymmetric built-up procedure where a stack is built-up only on one of front and back sides of a temporary carrier.

In a step S30, a temporary carrier 20 is provided. The temporary carrier 20 can comprise a base and copper foils at both main surfaces thereof. Electrically conductive layer structures 3 are provided at both main surfaces of the temporary carrier 20. For example, the electrically conductive layer structures 3 can be patterned or structured by conventional electroplating methods by use of copper which corresponds to the electrically conductive material 6 of the component carrier 1 (FIG. 1). In the embodiment, the electrically conductive layer structures 3 comprise a block 8 and pillars 31 which are formed at each main surface of the temporary carrier 20. A width of the block 8 measured in parallel to a main surface of the temporary carrier 20 can be at least twice as large, preferred at least three times as large as a width of the copper pillars 31.

In a step S31, further pillars 32 are applied onto the pillars 31. In particular, the further pillars 32 are axially aligned to the pillars 31. The further pillars 32 can be manufactured by conventional electroplating methods by use of an electrically conductive material such as copper which corresponds to the electrically conductive material 6 of the component carrier 1 (FIG. 1). One pillar 31 and the associated further pillar 32 form a double pillar 11 having a height "d". The pillars 31, the further pillar 32 and the block 8 form the electrically conductive layer structure 3.

In a step S32, the electrically conductive layer structures 3 are molded with a mold material. The mold material can form one of the at least two electrically insulating layer structures 2 which form a dielectric double layer 4 of the component carrier 1 (FIG. 1).

Alternatively, the electrically insulating layer structure 2 shown in step S32 can itself include the dielectric double layer having the two electrically insulating layer structures which can be made of different materials. In particular, at least one electrically insulating layer structure of the dielectric double layer can be a molded material, while at least one other electrically insulating layer structure of dielectric double layer comprises a resin, in particular resin without reinforcing structures, more particularly an epoxy derivative, in particular an epoxy-based build-up foil. For example, the pillars 31 can be embedded in one of the at least two electrically insulating layer structures 2 which form the dielectric double layer 4, and the further pillars 32 can be embedded in the other one of the at least two electrically insulating layer structures 2 which form the dielectric double layer 4.

In a step S33, a cavity 14 is formed in the electrically insulating layer structure 2. A depth of the cavity 14 extends up to the block 8.

In a step S34, a component 7 is embedded in the cavity 14 and placed or bonded on the block 8. The component 7 comprises pads (see FIG. 1) which are arranged on one main surface of the component 7, which is opposite to another main surface of the component 7, which is placed or bonded on the block 7. Thereafter, the stack with the embedded component 7 is encapsulated by an encapsulating material 9. The encapsulating material 9 can form one of the at least two electrically insulating layer structures 2 which form the dielectric double layer 4 of the component carrier 1 (FIG. 1). The component carrier 1 comprises the encapsulating material 9 as an additional molded structure 9, wherein the component 7 can be embedded in the stack and/or the molded structure 9.

In the embodiment of FIG. 6, the thickness d of a double pillar 11 in the stack is substantially equal to a sum "D" of the thickness of the block 8 and a thickness of the component 7.

In a modification of the embodiment of FIG. 6, a first layer of electrically insulating layer structures is applied on the temporary carrier 20, through-holes are formed in the first layer of electrically insulating layer structures, and the through-holes are filled with an electrically conductive material to form the pillars 31 and the block 8. Thereafter, a second layer of electrically insulating layer structures is applied on the first layer of electrically insulating layer structures, through-holes are formed in the second layer of electrically insulating layer structures, and these through-holes are filled with an electrically conductive material to form the further pillars 32 so as to obtain the stack which is shown in step S32. Thereafter, a cavity 14 is formed in the second layer of electrically insulating layer structures to obtain the stack which is shown in step S33. Thereafter, step S34 can be carried out. In this modification, the first and second layers of the electrically insulating layer structures can form a dielectric double layer made of two different materials.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
    a stack comprising a plurality of electrically insulating layer structures and at least one electrically conductive layer structure comprising a continuous pillar, wherein two of the at least two electrically insulating layer structures form a dielectric double layer made of two different materials, wherein one of the electrically insulating layer structures of the dielectric double layer is a molded structure of a mold material, wherein the mold material is molded against the continuous pillar, wherein the remaining electrically insulating layer structure of the dielectric double layer is a non-molded layer structure;
    a first through-hole extending through the molded structure of the dielectric double layer, wherein the first through-hole extends through the entire molded structure from a lowermost surface thereof to an uppermost surface thereof continuously;
    an electrically conductive material filling at least a part of the first through-hole so that the continuous pillar is formed, against which the mold material is molded;
    a component embedded in the non-molded layer structure of the dielectric double layer; and
    a second through-hole filled with electrically conductive material to contact a pad of the component, wherein the second through-hole extends through the non-molded layer structure of the dielectric double layer.

2. The component carrier according to claim 1, wherein the first through-hole includes a tapering portion.

3. The component carrier according to claim 2, wherein the tapering portion has a frustoconical shape.

4. The component carrier according to claim 1, wherein the first through-hole extends through the entire dielectric double layer.

5. The component carrier according to claim 1, wherein the second through-hole extends through the non-molded layer structure of the dielectric double layer.

6. The component carrier according to claim 1, wherein the second through-hole is a laser through-hole.

7. The component carrier according to claim 1, wherein the non-molded layer structure of the dielectric double layer comprises resin.

8. The component carrier according to claim 1, wherein
    a copper material of pads of the component and/or of the electrically conductive layer structures are adjacent to the molded structure.

9. The component carrier according to claim 1, further comprising:
    a thermally and electrically highly conductive block connected to the component.

10. The component carrier according to claim 9, wherein a main surface of the thermally and electrically highly conductive block is attached to a main surface of the component.

11. The component carrier according to claim 9, wherein the component is embedded more centrally in a thickness direction in the stack than the thermally and electrically highly conductive block.

12. The component carrier according to claim 9, wherein a thickness of a double pillar in the stack is substantially equal to a sum of the thickness of the thermally and electrically highly conductive block and a thickness of the component.

13. The component carrier according to claim 1, further comprising at least one of the following features:
    wherein the component is selected from a group consisting of an electronic component, an electrically non-conductive and/or electrically conductive inlay, a heat transfer unit, a light guiding element, an energy harvesting unit, an active electronic component, a passive electronic component, an electronic chip, a storage device, a filter, an integrated circuit, a signal processing component, a power management component, an opto-electronic interface element, a voltage converter, a cryptographic component, a transmitter and/or receiver, an electromechanical transducer, an actuator, a microelectromechanical system, a microprocessor, a capacitor, a resistor, an inductance, an accumulator, a switch, a camera, an antenna, a magnetic element, a further component carrier, and a logic chip;
    wherein at least one of the electrically conductive layer structures of the component carrier comprises at least one of the group consisting of copper, aluminum, nickel, silver, gold, palladium, and tungsten;
    wherein the electrically insulating layer structure comprises at least one of the group consisting of reinforced or non-reinforced resin, epoxy resin or Bismaleimide-Triazine resin, FR-4, FR-5, cyanate ester, polyphenylene derivate, glass, prepreg material, polyimide, polyamide, liquid crystal polymer, epoxy-based build-up film, polytetrafluoroethylene, a ceramic, and a metal oxide;
    wherein the component carrier is shaped as a plate;
    wherein the component carrier is configured as one of the group consisting of a printed circuit board, a substrate, and an interposer;
    wherein the component carrier is configured as a laminate-type component carrier.

14. A method of manufacturing a component carrier, comprising:
    forming a stack comprising a plurality of electrically insulating layer structures and at least one electrically conductive layer structure comprising a continuous pillar, wherein two of the at least two electrically insulating layer structures form a dielectric double layer made of two different materials, wherein one of the electrically insulating layer structures of the dielectric double layer is molded with a mold material, wherein the mold material is molded against the continuous pillar, wherein the remaining electrically insulating layer structure of the dielectric double layer is a non-molded layer structure;
    forming a first through-hole extending through the molded structure of the dielectric double layer, wherein a portion of the first through-hole extends through the entire molded structure from a lowermost surface thereof to an uppermost surface thereof continuously;
    at least partially filling the through-hole with an electrically conductive material, the electrically conductive material forming the continuous pillar, against which the mold material is molded;
    embedding a component in the non-molded layer structure of the dielectric double layer; and
    at least partially filling a second through-hole with electrically conductive material to contact a pad of the component, wherein the second through-hole extends through the non-molded layer structure of the dielectric double layer.

15. The method according to claim 14, further comprising:
forming at least two component carriers on both opposing main surfaces of a temporary carrier.

16. The method according to claim 14, wherein the through-hole has a tapering sidewall through-hole.

17. The method according to claim 14, wherein the first through-hole extends through the entire double dielectric layer.

18. The method according to claim 14, wherein the second through-hole extends only through the non-molded layer structure of the double dielectric double layer.

19. The method according to claim 14, wherein the second through-hole is formed by a laser.

20. The method according to claim 14, wherein the second through-hole is filled with an electrically conductive material and contacts a pad which is arranged in or adjacent the dielectric double layer and forms a bottom of the second through-hole.

21. The method according to claim 14, wherein at least one electrically insulating layer structure of the dielectric double layer is formed by applying a resin.

22. The method according to claim 14, further comprising:
arranging the component into a cavity of the stack.

23. The method according to claim 22, further comprising:
molding a molded structure, wherein the component is embedded in the stack and/or the molded structure.

24. The method according to claim 23, wherein a copper material of pads of the component and/or of the electrically conductive layer structures are adjacent to the molded structure.

25. The method according to claim 14, further comprising:
forming a thermally and electrically highly conductive block or inserting a copper inlay, and
connecting the same to the component.

26. The method according to claim 25, further comprising:
attaching a main surface of the block to a main surface of the component.

27. The method according to claim 25, wherein the component is embedded more centrally in a thickness direction in the stack than the thermally and electrically highly conductive block.

28. The method according to claim 25, wherein a thickness of a double pillar in the stack is substantially equal to a sum of the thickness of the thermally and electrically highly conductive block and a thickness of the component.

* * * * *

UNITED STATES PATENT AND TRADEMARK OFFICE
CERTIFICATE OF CORRECTION

PATENT NO. : 12,207,399 B2
APPLICATION NO. : 17/247378
DATED : January 21, 2025
INVENTOR(S) : Jeesoo Mok Page 1 of 1

It is certified that error appears in the above-identified patent and that said Letters Patent is hereby corrected as shown below:

In the Claims

In Claim 16, in Column 17, Line 6, after "sidewall" remove -- through-hole --.

In Claim 18, in Column 17, Line 11, after "extends" remove -- only --.

In Claim 18, in Column 17, Line 32, after "the" remove -- double --.

Signed and Sealed this
Twenty-second Day of July, 2025

Coke Morgan Stewart
*Acting Director of the United States Patent and Trademark Office*